Oct. 2, 1962 J. J. NYBERG 3,056,889

HEAT-RESPONSIVE SUPERCONDUCTIVE DEVICES

Filed May 19, 1958

2 Sheets-Sheet 1

INVENTOR.
JAMES J. NYBERG

BY [signature]

ATTORNEY

Oct. 2, 1962 J. J. NYBERG 3,056,889

HEAT-RESPONSIVE SUPERCONDUCTIVE DEVICES

Filed May 19, 1958 2 Sheets-Sheet 2

INVENTOR.
JAMES J. NYBERG

BY [signature]

ATTORNEY

United States Patent Office 3,056,889

Patented Oct. 2, 1962

3,056,889

HEAT-RESPONSIVE SUPERCONDUCTIVE DEVICES

James J. Nyberg, Torrance, Calif., assignor, by mesne assignments, to Thompson Ramo Wooldridge Inc., Cleveland, Ohio, a corporation of Ohio Filed May 19, 1958, Ser. No. 736,118

6 Claims. (Cl. 307—88.5)

This invention relates to devices including superconductive elements and more particularly to a new and improved device including a superconductor which may be switched from a superconductive state to an electrically resistive state in response to a change in temperature.

In the investigation of the electrical properties of materials at very low temperatures, it has been found that the electrical resistance of many materials either disappears or drops so low as to be incapable of measurement as the temperature of the material is lowered near absolute zero (0° Kelvin). Thus, the material may be said to be superconductive.

The temperature at which a particular material changes from a normally electrically resistive state to a superconductive state may be altered where the material is subjected to a magnetic field. The magnetic field may be applied from an external source or may be generated by the flow of current through the superconductive material. Accordingly, electrical circuits employing superconductive elements, i.e., superconductors, have been proposed in which the superconductor is held at a constant temperature and is switched from a superconductive to an electrically resistive state in response to a magnetic field derived in some instances from an external source and in other instances from a flow of current through the superconductor itself. In addition, some work has been done in developing electrical circuits in which a superconductor is switched from a superconductive state to an electrically resistive state in response to a change in temperature of the superconductor produced by heat applied to the superconductor from an external source. It is contemplated that electrical circuits employing superconductive elements will find wide usage in data processing and computer systems requiring high speed and small size.

The circuits of the present invention operate in accordance with a change in temperature of a superconductor through the application of heat from an external source working in conjunction with the generation of heat by current flow through the superconductor itself while in an electrically resistive state.

Accordingly, it is a principal object of the present invention to provide a new and improved electrical circuit in which a superconductor is switched from a superconductive state to an electrically resistive state.

It is an additional object of the present invention to provide a new and improved bistable circuit device in which a superconductor is in a superconductive state in one condition of operation and is in an electrically resistive state in another condition of operation.

It is another object of the present invention to provide a new and improved electrical circuit device utilizing a superconductor in which an output circuit is conductively separated from an input circuit.

It is a still further object of the invention to provide an electrical circuit utilizing a superconductor having a high current gain and a fast speed of operation.

Briefly, in accordance with the invention, at least one superconductor is operated under environmental conditions in which the superconductor assumes a superconductive condition, the temperature of the superconductor is elevated by the application of heat thereto so that it becomes resistive, and current is passed through the superconductor of a value sufficient to maintain the superconductor in an electrically resistive state.

In a particular embodiment of the present invention, a bistable circuit is provided in which the superconductor is in a superconductive state in one condition of operation and an electrically resistive state in a second condition of operation.

A better understanding of the invention may be had from a reading of the following detailed description taken in conjunction with the drawings, in which.

As noted above, at temperatures near absolute zero, some materials lose all resistance to the flow of electrical current and become perfect conductors. The phenomenon is called superconductivity and the temperature at which the change occurs from a normally resistive state to the superconductive state is called the transition temperature. For example, the following materials have a transition temperature and become superconductive at the temperature listed:

| | ° Kelvin |
|---|---|
| Mercury | 4.12 |
| Niobium | 8 |
| Lead | 7.2 |
| Vanadium | 5.1 |
| Tantalum | 4.4 |
| Tin | 3.7 |
| Indium | 3.3 |
| Tellurium | 2.4 |
| Aluminum | 1.2 |

Only a few of the materials exhibiting superconductivity are listed above. Other elements and many alloys and compounds become superconductive at temperatures ranging between 0° and 17° Kelvin. A discussion of many such materials may be found in a book entitled "Superconductivity," by D. Schoenberg, Cambridge University Press, Cambridge, England, 1952.

The devices of the present invention accomplish a change of state of a superconductor primarily through an elevation of the temperature of the superconductor above its transition temperature. The change of the superconductor from a superconductive state to an electrically resistive state may be used to control the flow of an electrical current or to produce an output signal, as for example, in the logical circuits of a digital computer.

Figure 1:
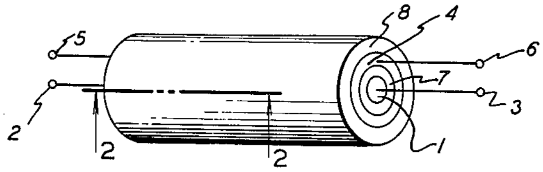
FIG. 1 is a perspective view of a superconductive device for use in accordance with the invention.
Figure 2:
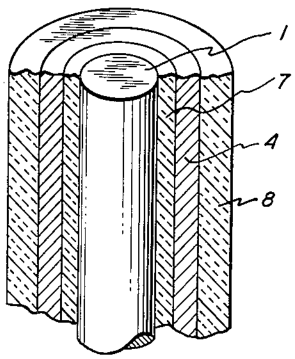
FIG. 2 is an enlarged sectional view taken along line 2—2 of FIG. 1.

The device illustrated in FIGS. 1 and 2 includes a superconductor 1 of a selected superconductive material connected between a pair of terminals 2 and 3. The superconductor 1 is surrounded by a control element 4 connected between the terminals 5 and 6 which is preferably of a material which is electrically resistive at the temperature of operation of the device. A layer of electrical insulation 7 is disposed between the superconductor 1 and the control element 4, and a layer of thermal insulation 8 surrounds the control element 4.

In operation, the device of FIG. 1 is held at a temperature below the transition temperature of the material of the superconductor 1 so that the superconductor 1 will normally be in a superconductive state, presenting zero electrical resistance between the terminals 2 and 3. However, by passing a current through the control element 4 via the terminals 5 and 6, heat may be generated to raise the temperature of the superconductor 1 above the transition temperature of the material of which the superconductor 1 is constructed so that an electrical resistance appears between the terminals 2 and 3.

Figure 3:
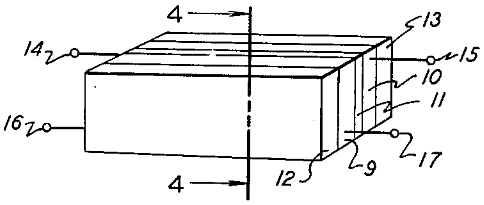
FIG. 3 is an alternative arrangement of a superconductive device for use in accordance with the invention.
Figure 4:
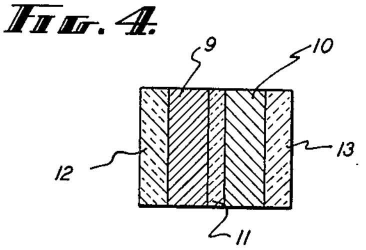
FIG. 4 is a sectional view taken along line 4—4 of FIG. 3.

FIGS. 3 and 4 illustrate an alternative arrangement of a superconductive device for use in accordance with the invention in which a superconductor 9 of a selected superconductive material is separated from a control element 10 by a layer of electrical insulation 11. Thermal insulation layers 12 and 13 may be included on each side of the device. The terminals 14 and 15 are connected serially with the control element 10 while the terminals 16 and 17 are connected serially with the superconductor 9.

The device of FIGS. 3 and 4 may be operated in a similar manner to that described above in connection with FIG. 1 so that passing current through the control element via the terminals 14 and 15 causes heat to be generated which raises the temperature of the superconductor 9 to a level at which the superconductor switches to an electrically resistive state to present an electrical resistance between the terminals 16 and 17.

An important feature of the devices of FIGS. 1–4 is that a current of a given magnitude flowing through a control element may be employed to control the magnitude of a much larger current flowing in a superconductor. Accordingly, the devices are capable of a current gain which is larger than the current gain obtained in devices in which a superconductor is switched from a superconductive to an electrically resistive state in response to the application of a magnetic field.

Figure 5:
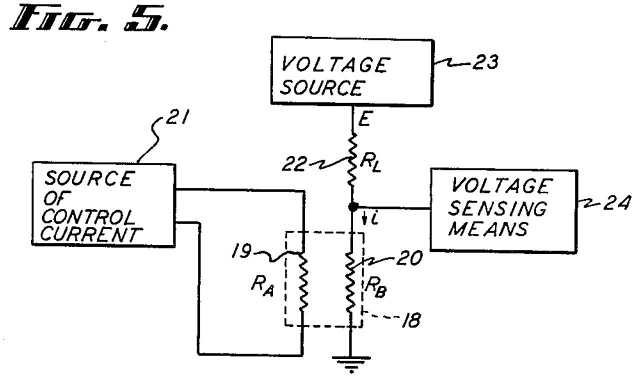
FIG. 5 is a combined block and schematic circuit diagram of a latching circuit in accordance with the invention.

FIG. 5 illustrates one way in which the devices of FIGS. 1–4 may be employed in a latching circuit. The circuit of FIG. 5 includes a superconductive device 18 having a control element 19 and a superconductor 20. For convenience of illustration, the control element 19 and the superconductor 20 have been shown by means of conventional symbols for resistance elements. However, it will be appreciated that while the control element 19 may be electrically resistive at all times at the temperature of operation of the device, the superconductor 20 is capable of being either superconductive or electrically resistive depending upon its temperature. By passing a current through the control element 19 from a source of control current 21, heat may be generated for raising the temperature of the superconductor 20.

Connected serially with the superconductor 20 is a fixed resistor 22 and a voltage source 23. When the superconductor 20 is in a superconductive state, the amount of current, $I_1$, flowing from the voltage source 23 is equal to its value E divided by the resistance value of the resistor 22, $R_L$. Since the resistance of the superconductor 20 in a superconductive state is zero, a voltage sensing means 24 connected between the resistor 22 and the superconductor 20 receives a zero voltage.

On the other hand, when a current is passed from the source of control current 21 through the resistor 19 of a sufficient magnitude to raise the temperature of the superconductor 20 to a level at which it switches to an electrically resistive state, the current flow from the voltage source 22 is $$I_2=\frac{E}{R_L+R_B}$$

where $R_B$ equals the resistance value of the superconductor in an electrically resistive state. Thus, the voltage from the voltage source 23 divides between the resistor 22 and the superconductor 20 so that a finite value of voltage is received by the voltage sensing means 24.

Since heat is generated by the flow of the current $I_2$ through the superconductor 20 while in an electrically resistive state, a suitable selection of the value of the voltage E from the voltage source 23, the resistor 22 and the material of which the superconductor 20 is constructed leads to a sufficient amount of heat being generated within the superconductor 20 to maintain the temperature of the superconductor 20 above its transition temperature so that the electrically resistive state initiated by the passage of current through the source of control current 21 is maintained and a voltage is received by the voltage sensing means 24 even after current flow from the source of control current 21 has ceased.

Accordingly, the device of FIG. 5 has two stable conditions of operation. In a first condition the superconductor 20 is in a superconductive state and no voltage appears at the voltage sensing means 24, and in a second condition the superconductor 20 is in an electrically resistive state and a finite voltage value is received by the voltage sensing means 24. Due to the action of the circuit of FIG. 5 in sustaining the second condition of operation once established, the circuit may be referred to as a latching circuit.

Figure 6:
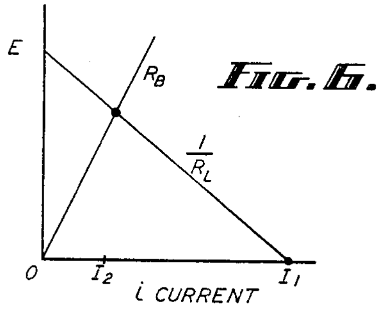
FIG. 6 is a graphical illustration of the relationship between a voltage and a current in the circuit of FIG. 5.

The relationship between the voltage from the voltage source 23 and the current flow through the superconductor 20 is illustrated in FIG. 6. The slope of the curve is determined by the resistance value $R_B$ of the superconductor 20 in an electrically resistive state. Superimposed upon the curve of FIG. 6 is a load line representing the value of $1/R_L$. The point at which the load line intersects the curve represents the value of the current, $I_2$, when the superconductor 20 is electrically resistive and the circuit of FIG. 5 is in its second or latched condition of operation in which a voltage is received by the voltage sensing means 24. On the other hand, the point of intersection of the load line with the zero voltage axis represents the current flow $I_1$ when the superconductor 20 is in a superconductive state and no voltage is received by the voltage sensing means 24.

Where the device of FIG. 5 is in the second or latched stable condition of operation in which the current $I_2$ flows through the electrically resistive superconductor 20, the first or unlatched stable condition of operation may be achieved by either reduction in the voltage from the voltage source 23 or an interruption of the current flow $I_2$. On the other hand, where the circuit of FIG. 5 is in the first or unlatched stable condition of operation in which a current $I_1$ flows through the superconductor 20 in a superconductive state, the second stable condition of operation may be achieved through the passage of a sufficiently large current from the source of control current 21 through the control element 19.

Figure 7:
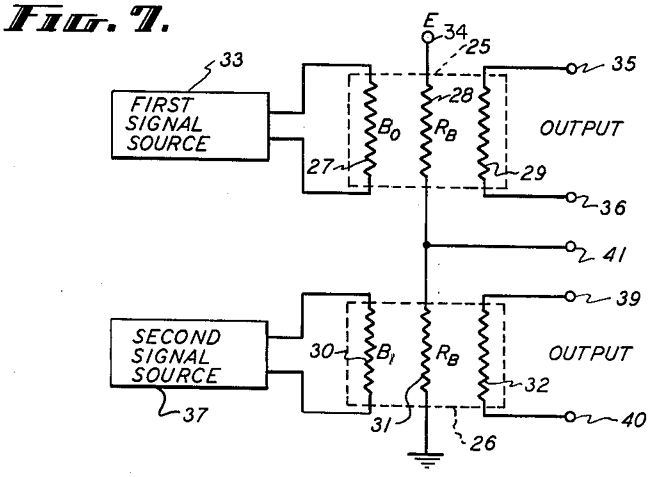
FIG. 7 is a block and schematic circuit diagram of a flip-flop circuit in accordance with the invention.

An alternative arrangement of a bistable flip-flop circuit is illustrated in FIG. 7 employing two separate superconductive devices 25 and 26. The upper superconductive device includes a control element 27, a superconductor 28 and an output circuit element 29, all of which are represented by conventional resistance element symbols. It will be appreciated that the elements may or may not be electrically resistive at any given time, depending upon the condition of operation of the device. Similarly, the lower superconductive device 26 includes a control element 30, a superconductor 31 and an output circuit element 32 represented by conventional resistance element symbols.

The superconductors 28 and 31 of the devices 25 and 26 are connected serially between a voltage input terminal 34 and ground reference potential. By selecting a suitable value of voltage E applied to the voltage supply terminal 34 with respect to the resistance values of the superconductors 28 and 31 while in an electrically resistive state, only one of the superconductive elements 28 and 31 is capable of being in an electrically resistive state at any one given time. That is, where the voltage E attempts to divide equally between the superconductors 28 and 31, the amount of heat generated in each superconductor is equal to $$\frac{E^2}{4R_B}$$

which is inadequate to maintain either of the superconductors 28 and 31 above the transition temperature. Nor can both of the superconductors 28 and 31 be superconductive at the same given time due to the fact that the current flow produced by the voltage E would rise to an extremely large value through a zero resistance and would cause one of the superconductors 28 and 31 to become electrically resistive since an extremely large current generates a magnetic field which lowers the transition temperature for any given material.

On the other hand, where only one of the superconductors 28 and 31 is electrically resistive, four times as much heat is generated in the electrically resistive superconductor equal to $$\frac{E^2}{R_B}$$

so that the amount of heat generated may be sufficiently large to sustain an electrically resistive state in the superconductor. An input current from a first signal source 33 may be passed through the control element 27 of the upper superconductive device 25 to generate sufficient heat to force the superconductor 28 into an electrically resistive state.

During the period in which the current flow obtains through the control element 27, the current flow through the lower superconductor 31 drops to a level insufficient to maintain it in an electrically resistive state so that the superconductor 31 of the lower superconductive device 26 assumes a superconductive state, and the current flow through the upper superconductor 28 rises to a level at which the superconductor 28 is maintained electrically resistive even after current has ceased to flow through the control element 27.

The output circuit element 29 may be constructed of a material which is capable of being switched from a superconductive state to an electrically resistive state and may be so related to the superconductor 28 as to be elevated in temperature to become electrically resistive in response to heat generated by current flow through the upper superconductor 28 while the superconductor 28 is in an electrically resistive state.

Accordingly, when the circuit of FIG. 7 is in the condition of operation in which the superconductor 28 is electrically resistive, an electrical resistance is presented to the flow of current between the output terminals 35 and 36 to which may be connected a suitable output circuit (not shown).

On the other hand, by the passing of a current through the lower control element 30 from a second signal source 37, the condition of operation of the circuit of FIG. 7 may be switched so that the superconductor 31 becomes electrically resistive and the superconductor 28 resumes a superconductive state. Due to the heat generated within the superconductor 31 by the current flow therethrough, the superconductor 31 may be maintained in an electrically resistive state to generate sufficient heat to render a superconductive output circuit element 32 electrically resistive. In the condition of operation in which the superconductor 31 is electrically resistive, a resistance appears between the output terminals 39 and 40 to which may be connected another suitable output circuit (not shown).

Although the circuit of FIG. 7 has been illustrated with electrically separate output circuit elements 29 and 32 connected to the output terminals 39 and 40, an output voltage may also be derived from a terminal 41. A voltage from the terminal 41 has a finite value when the circuit is in the stable condition of operation in which the lower superconductor 31 is electrically resistive and has zero value when the circuit is in the other stable condition of operation in which the lower superconductor 31 is superconductive.

Figure 8:
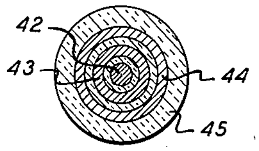
FIG. 8 is an enlarged cross-sectional view of a superconductive device which may be used in the circuit of FIG. 7.

FIG. 8 is a cross-sectional view of one arrangement of a superconductor, a control element, and an output circuit element which may be employed in the circuit of FIG. 7. In FIG. 8 an output circuit element 42 is centrally disposed and surrounded by a superconductor 43 which is in turn surrounded by a control element 44. Each of the current conducting elements 42, 43 and 44 may be separated by an electrical resistance layer and a layer of thermal insulation 45 may be placed around the control element 44.

In operation, the current flow through the control element 44, which is preferably electrically resistive at all times, generates sufficient heat to elevate the superconductor 43 to a level at which the superconductor assumes an electrically resistive state. Where the device of FIG. 8 is connected in a circuit such as that of FIG. 7, additional current may be passed through the superconductor 43 which generates an amount of heat sufficient to maintain the superconductor 43 in an electrically resistive state even after the cessation of flow of current through the control element 44.

In addition, by selecting a suitable material for the output circuit element 42, the temperature of the output circuit element 42 may be raised to a level at which the output circuit element becomes electrically resistive in response to the amount of heat generated by current flow through the superconductor 43. Accordingly, the current flow through the superconductor 43 not only functions to latch the circuit in a stable condition of operation, but also functions to switch the output circuit element from a superconductive to an electrically resistive state, thereby providing an indication of the condition of operation of the device.

Due to the fact that three separate circuit elements are employed for the control element, the superconductor, and the output circuit element in the arrangements of FIGS. 7 and 8, considerable electrical power gain may be obtained so long as the heat generated by current flow through the output circuit elements 29 and 32 while in an electrically resistive state is not so large as to exert a control over the condition of the superconductors.

The bistable circuit of FIG. 7 may be used to advantage as either a memory circuit or logical circuit element in a data processing system or digital computer adapted to handle information in the form of binary number values. Thus, a signal from the first signal source 33 may represent a binary "0" value while a signal from the second signal source 37 may represent a binary "1" value. The bistable circuit thus provides an output signal represented by the electrically resistive condition of the output circuit elements 29 and 32 or the voltage at the terminal 41 which corresponds to the binary number value. By interconnecting a number of bistable circuits similar to FIG. 7, along with other conventional or superconductive memory and logical circuit elements, a system for performing a computation or manipulation of digital information may be provided.

The superconductive devices of FIGS. 1–4 and 8 may be constructed by vacuum deposition techniques in which thin films of materials are deposited one upon the other. Where the device is to be cylindrical as in FIGS. 1, 2 and 8, the innermost element may comprise a finely drawn wire upon which insulating layers and the other elements are deposited alternately. On the other hand, where the device is to be in the configuration as illustrated generally in FIGS. 3 and 4, the thin films of material may be built up successively. Of course, the electrical resistance of the elements is a function of the cross-sectional area. Therefore, in order to achieve a high resistance, the elements should be relatively small in cross-section.

Figure 9:
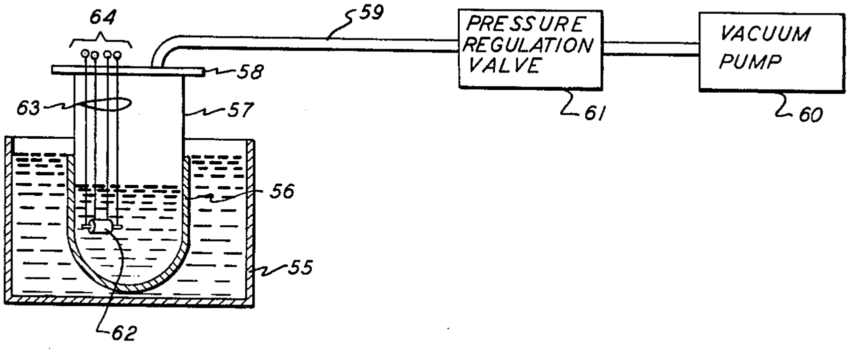
FIG. 9 is a diagrammatic view of apparatus for maintaining the superconductive circuit devices of the invention at a predetermined low operating temperature.

FIG. 9 is a diagrammatic illustration of an arrangement for maintaining the circuits of the present invention at a suitable low temperature near absolute zero at which the superconductors assume a normally superconductive state. In FIG. 9 there is shown an exterior insulated container 55 which is adapted to hold a coolant such as liquid nitrogen. Within the container 55 an inner insulated container 56 is suspended for holding a coolant such as liquid helium which maintains the circuits of the invention at a proper operating temperature. Since the boiling point of helium at atmospheric pressure is 4.2° Kelvin, that operating temperature may be readily sustained. In order to achieve other operating temperatures, the top of the container 56 may be sealed by a sleeve 57 and lid 58 through which a conduit 59 connects the inner chamber with a vacuum pump 60 and a pressure regulation valve 61. The pump 60 functions to lower the pressure within the chamber to control the temperature of the helium. The pressure regulation valve 61 functions to regulate the pressure within the chamber so that the temperature is held constant. One or more circuits 62 of the invention may be suspended in the liquid helium at the proper operating temperature at which the circuit components are superconductive. Connection to the circuits 62 is made by lead-in wires 63 which may also be constructed of a superconductive material within the cooled region to minimize resistance. The lead-in wires 63 extend through the lid 58 to the terminals 64.

Where the superconductive devices described above are operated in a liquid helium bath having a temperature lower than 2.19° Kelvin, a phenomenon occurs which enhances the efficiency and speed of operation of the devices. At temperatures below 2.19° Kelvin, it has been found that a phase of liquid helium appears which conducts heat with zero temperature gradient. Thus, where the superconductor circuits and devices in accordance with the invention are immersed in liquid helium below 2.19° Kelvin, the constant temperature at the outside surface of each of the devices results in a short thermal time constant since the device or circuit is essentially surrounded by a perfect heat conductor.

An alternative arrangement of the superconductive devices and circuits of the invention which may be useful for some applications is the omission of the thermal insulating layers. In the superconductive state a particular superconductive device does not produce any heat. On the other hand, in an electrically resistive state with current flow, the heat released from the outside surface of a device without thermal insulation may be arranged to produce a layer of helium gas which functions as an insulator to tend to confine the heat within the device. In a bistable arrangement such as that illustrated in FIG. 7, the latching operation of the current flow through the superconductor in maintaining an established electrically resistive state is enhanced due to the insulating characteristic of the layer of helium gas surrounding the device. The confined heat tends to maintain the superconductor in an electrically resistive state which enhances the latching operation described above.

By means of the invention there is provided a new and improved superconductive circuit device in which a superconductor may be switched to an electrically resistive state in response to a change in temperature. Although particular structural arrangements have been illustrated above, it is intended that these arrangements be by way of example only. Accordingly, the invention should be given the full scope of any alternative arrangements or modifications falling within the scope of the annexed claims.

What is claimed is:

1. A bistable circuit including the combination of a first superconductor, a second superconductor connected serially with the first superconductor, each of said superconductors being capable of being switched from a superconductive condition to an electrically resistive condition in response to a change in temperature, means passing a current through the first and second superconductors of a magnitude sufficiently large to render one of the superconductors electrically resistive, said current being insufficient to maintain both of said superconductors electrically resistive at the same time, a first heat applying means thermally coupled to the first superconductor for raising the temperature of the first superconductor to a level at which the first superconductor is switched to an electrically resistive condition, said current being adapted to maintain the electrically resistive condition of the first superconductor in one stable condition of operation, a second heat applying means thermally coupled to the second superconductor for elevating the temperature of the second superconductor to a level at which the second superconductor assumes an electrically resistive condition, said current being adapted to maintain the second superconductor in an electrically resistive condition in a second stable condition of operation, and means deriving an output signal from the first and second superconductors identifying which of the two stable conditions of operation obtains in the circuit at any given time.

2. A bistable circuit including the combination of a first superconductor, a second superconductor connected serially with the first superconductor, each of said superconductors being capable of being switched from a superconductive condition to an electrically resistive condition in response to a change in temperature, means applying a voltage across the first and second superconductors of a magnitude sufficiently large to render one of the superconductors electrically resistive, said voltage being insufficient to maintain both of said superconductors electrically resistive at the same time, a first electrically resistive element thermally coupled to the first superconductor for generating and applying heat to the first superconductor, a first signal source connected to the first electrically resistive element for elevating the temperature of the first superconductor to a level at which the superconductor assumes an electrically resistive condition, a second electrically resistive element thermally coupled to the second superconductor for generating and applying heat to the second superconductor, a second signal source connected to the second electrically resistive element for elevating the temperature of the second superconductor to a level at which the superconductor assumes an electrically resistive condition, and means deriving an output signal from the first and second superconductors identifying which of the two stable conditions of operation obtains in the circuit at any given time.

3. A bistable circuit including the combination of a first superconductor, a second superconductor connected serially with the first superconductor, each of said superconductors being capable of being switched from a superconductive condition to an electrically resistive condition in response to a change in temperature, means passing a current through the first and second superconductors of a magnitude sufficiently large to render one of the superconductors electrically resistive, said current being insufficient to maintain both of said superconductors electrically resistive at the same time, a first heat applying means thermally coupled to the first superconductor for raising the temperature of the first superconductor to a level at which the first superconductor is switched to an electrically resistive condition, said current being adapted to sustain the electrically resistive condition of the first superconductor in one stable condition of operation, a second heat applying means thermally coupled to the second superconductor for elevating the temperature of the second superconductor to a level at which the second superconductor assumes an electrically resistive condition, said current being adapted to maintain the second superconductor in an electrically resistive condition in a second stable condition of operation, a first output circuit element thermally coupled to the first superconductor which is capable of being rendered electrically resistive in response to heat generated by current flow through the first superconductor while in an electrically resistive condition, and a second output circuit element thermally coupled to the second superconductor which is capable of being rendered electrically resistive in response to heat generated by the superconductor in response to current flow through the superconductor in an electrically resistive condition whereby in one stable condition of operation one of the output circuit elements is rendered electrically resistive and in another stable condition of operation the other of the output circuit elements is rendered electrically resistive.

4. A bistable circuit including the combination of a first superconductor, a second superconductor connected serially with the first superconductor, each of said superconductors being capable of being switched from a superconductive condition to an electrically resistive condition in response to a change in temperature, means applying a voltage across the first and second superconductors of a magnitude sufficiently large to render one of the superconductors electrically resistive, said voltage being insufficient to maintain both of said superconductors electrically resistive at the same time, a first electrically resistive element thermally coupled to the first superconductor for generating and applying heat to the first superconductor, a first signal source connected to the first electrically resistive element for elevating the temperature of the first superconductor to a level at which the superconductor assumes an electrically resistive condition, a second electrically resistive element thermally coupled to the second superconductor for generating and applying heat to the second superconductor, a second signal source connected to the second electrically resistive element for elevating the temperature of the second superconductor to a level at which the superconductor assumes an electrically resistive condition, a first output circuit thermally coupled to the first superconductor which is capable of being rendered electrically resistive in response to heat generated by current flow through the first superconductor while in an electrically resistive condition, and a second output circuit thermally coupled to the second superconductor which is capable of being rendered electrically resistive in response to heat generated by the superconductor in response to current flow through the superconductor in an electrically resistive condition whereby in one stable condition of operation one of the output circuits is rendered electrically resistive and in another stable condition of operation the other of the output circuits is rendered electrically resistive.

5. A superconductive circuit element for controlling the flow of current of a given magnitude in response to the flow of current of a lesser magnitude including the combination of a superconductor which is capable of being switched from a superconductive condition to an electrically resistive condition in response to a change in temperature, an electrically resistive element thermally coupled to the superconductor for generating heat in response to a control current for elevating the temperature of the superconductor to a level at which the superconductor becomes electrically resistive, a layer of thermal insulation surrounding the superconductor and the electrically resistive element, a quantity of a material enclosing the thermal insulation having a capacity to conduct heat with a zero temperature gradient, and means maintaining the material at a predetermined temperature level at which the superconductor is in a superconductive condition in the absence of heat being generated by the electrically resistive element whereby the combination of the superconductor, the electrically resistive element and the layer of thermal insulation possess a low thermal time constant so that the superconductor may be rapidly returned to a superconductive condition from an electrically resistive condition.

6. Apparatus in accordance with claim 5 in which the material enclosing the layer of thermal insulation comprises liquid helium held at a temperature below 2.19° Kelvin.

References Cited in the file of this patent

UNITED STATES PATENTS

| | | |
|---|---|---|
| 2,189,122 | Andrews | Feb. 6, 1940 |
| 2,533,286 | Schmitt | Dec. 12, 1950 |
| 2,666,884 | Ericsson et al. | Jan. 19, 1954 |
| 2,832,897 | Buck | Apr. 29, 1958 |
| 2,877,448 | Nyberg | Mar. 10, 1959 |